(12) United States Patent
Thothadri et al.

(10) Patent No.: US 11,758,757 B2
(45) Date of Patent: *Sep. 12, 2023

(54) FLEXIBLE COVER LENS FILMS

(71) Applicant: Applied Materials, Inc., Santa Clara, CA (US)

(72) Inventors: Manivannan Thothadri, Mountain View, CA (US); Daniel Paul Forster, San Jose, CA (US); Robert F. Praino, Jr., Westwood, MA (US); Harvey You, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 129 days.

This patent is subject to a terminal disclaimer.

(21) Appl. No.: 17/231,387

(22) Filed: Apr. 15, 2021

(65) Prior Publication Data

US 2021/0257593 A1     Aug. 19, 2021

Related U.S. Application Data

(63) Continuation of application No. 16/114,776, filed on Aug. 28, 2018, now Pat. No. 10,985,344.

(Continued)

(51) Int. Cl.
*H10K 50/844*     (2023.01)
*G02F 1/1333*     (2006.01)
(Continued)

(52) U.S. Cl.
CPC ..... *H10K 50/844* (2023.02); *G02F 1/133305* (2013.01); *G02F 1/133526* (2013.01); *H10K 77/111* (2023.02); *H10K 2102/311* (2023.02)

(58) Field of Classification Search
CPC ............ H01L 51/5253; H01L 51/0097; H01L 2251/5338; G02F 1/133305;
(Continued)

(56) References Cited

U.S. PATENT DOCUMENTS 6,512,512 B1   1/2003  Blanchard
6,660,388 B2  12/2003  Liu et al.
(Continued)

FOREIGN PATENT DOCUMENTS

CN    1446371 A   10/2003
CN    1928637 A    3/2007
(Continued)

OTHER PUBLICATIONS

Chinese Office Action dated Apr. 27, 2022 for Application No. 201980029310.7.

(Continued)

*Primary Examiner* — Lex H Malsawma
(74) *Attorney, Agent, or Firm* — PATTERSON + SHERIDAN, LLP

(57) ABSTRACT

Flexible display devices, such as flexible cover lens films, are discussed and provided herein. The flexible cover lens film has good strength, elasticity, optical transmission, wear resistance, and thermostability. The cover lens film includes a hard coat layer with a thickness from about 5 μm to 40 μm, an impact absorption layer with a thickness from about 20 μm to 110 μm, and a substrate layer with a thickness from about 10 μm to 175 μm and is disposed between the hard coat layer and the impact absorption layer. By combining the hard coat layer and the impact resistant layer, the cover lens film is both flexible and strong with hardness from 6H to 9H.

20 Claims, 3 Drawing Sheets

Related U.S. Application Data

(60) Provisional application No. 62/578,175, filed on Oct. 27, 2017.

(51) Int. Cl.
*G02F 1/1335* (2006.01)
*H10K 77/10* (2023.01)
*H10K 102/00* (2023.01)

(58) Field of Classification Search
CPC ............ G02F 1/133526; H10K 50/844; H10K 77/111; H10K 2102/311
See application file for complete search history.

(56) References Cited

U.S. PATENT DOCUMENTS

| | | |
|---|---|---|
| 6,781,642 B2 | 8/2004 | Nakanishi et al. |
| 6,841,190 B2 | 1/2005 | Liu et al. |
| 6,872,114 B2 | 3/2005 | Chung et al. |
| 7,071,927 B2 | 7/2006 | Blanchard |
| 7,326,313 B2 | 2/2008 | Lee et al. |
| 7,342,080 B2 | 3/2008 | Qiu et al. |
| 7,880,967 B2 | 2/2011 | Taketomo et al. |
| 8,580,378 B2 | 11/2013 | Noguchi |
| 8,618,531 B2 | 12/2013 | Alden et al. |
| 8,693,099 B2 | 4/2014 | Kawashima et al. |
| 9,023,162 B2 | 5/2015 | McCormick et al. |
| 9,475,947 B2 | 10/2016 | Sirois |
| 10,034,395 B2 | 7/2018 | Shin |
| 10,096,792 B2 | 10/2018 | Ahn et al. |
| 10,211,421 B2 | 2/2019 | Lee et al. |
| 10,237,989 B1 | 3/2019 | Peters et al. |
| 10,241,377 B1 | 3/2019 | Wang et al. |
| 10,545,537 B2 | 1/2020 | Ahn et al. |
| 10,566,570 B2 | 2/2020 | Bu et al. |
| 10,632,711 B2 | 4/2020 | Lee et al. |
| 10,752,808 B2 | 8/2020 | Ono |
| 10,985,344 B2 * | 4/2021 | Thothadri ................ G02B 1/14 |
| 2002/0114934 A1 | 8/2002 | Liu et al. |
| 2002/0122925 A1 | 9/2002 | Liu et al. |
| 2005/0249944 A1 | 11/2005 | Wang et al. |
| 2006/0275950 A1 | 12/2006 | Lee |
| 2006/0278333 A1 | 12/2006 | Lee et al. |
| 2007/0196633 A1 | 8/2007 | Coak et al. |
| 2008/0047468 A1 | 2/2008 | de Rojas |
| 2008/0241524 A1 | 10/2008 | Fukuda et al. |
| 2008/0311351 A1 | 12/2008 | Hsu et al. |
| 2009/0130472 A1 | 5/2009 | Kondo et al. |
| 2009/0311539 A1 | 12/2009 | Larson-Smith et al. |
| 2010/0028608 A1 | 2/2010 | Choi et al. |
| 2010/0118406 A1 | 5/2010 | Kobori et al. |
| 2010/0330359 A1 | 12/2010 | Ishikawa et al. |
| 2013/0122230 A1 | 5/2013 | Tsai et al. |
| 2013/0236713 A1 | 9/2013 | Park et al. |
| 2014/0147662 A1 | 5/2014 | Ishikawa et al. |
| 2014/0322471 A1 | 10/2014 | Liu et al. |
| 2014/0322472 A1 | 10/2014 | McCormick et al. |
| 2015/0125679 A1 | 5/2015 | Ishikawa |
| 2015/0167170 A1 | 6/2015 | Ranade et al. |
| 2015/0266272 A1 | 9/2015 | Lee et al. |
| 2015/0275040 A1 | 10/2015 | Shi et al. |
| 2016/0024348 A1 | 1/2016 | Kim et al. |
| 2016/0046830 A1 | 2/2016 | Kim et al. |
| 2016/0200939 A1 | 7/2016 | Cho et al. |
| 2016/0208130 A1 | 7/2016 | Ishikawa et al. |
| 2016/0306392 A1 | 10/2016 | Park |
| 2016/0372701 A1 | 12/2016 | Kwon et al. |
| 2017/0065950 A1 | 3/2017 | Schenck et al. |
| 2017/0095993 A1 | 4/2017 | Tomomatsu et al. |
| 2017/0165950 A1 | 6/2017 | Leatherdale et al. |
| 2017/0170416 A1 | 6/2017 | Johnson et al. |
| 2017/0183257 A1 | 6/2017 | Apitz et al. |
| 2017/0183462 A1 | 6/2017 | Song et al. |
| 2017/0217143 A1 | 8/2017 | Kim et al. |
| 2017/0253707 A1 | 9/2017 | Lim et al. |
| 2017/0276840 A1 | 9/2017 | Horio et al. |
| 2018/0196169 A1 | 7/2018 | Choi et al. |
| 2018/0264790 A1 | 9/2018 | Leatherdale et al. |
| 2018/0265731 A1 | 9/2018 | Ekinaka et al. |
| 2018/0294441 A1 | 10/2018 | Brotzman et al. |
| 2018/0346760 A1 | 12/2018 | Kim et al. |
| 2018/0372921 A1 | 12/2018 | Washio et al. |
| 2019/0086760 A1 | 3/2019 | Wang et al. |
| 2019/0131571 A1 | 5/2019 | Thothadri et al. |
| 2019/0293921 A1 | 9/2019 | Nam et al. |
| 2019/0377105 A1 | 12/2019 | Lim et al. |
| 2019/0383973 A1 | 12/2019 | Jang et al. |
| 2020/0020256 A1 | 1/2020 | Spiro et al. |
| 2020/0057178 A1 | 2/2020 | Thothadri et al. |
| 2020/0081162 A1 | 3/2020 | Park et al. |
| 2020/0095469 A1 | 3/2020 | Yu et al. |
| 2020/0123410 A1 | 4/2020 | Reit et al. |

FOREIGN PATENT DOCUMENTS

| | | |
|---|---|---|
| CN | 1950723 A | 4/2007 |
| CN | 100549064 C | 10/2009 |
| CN | 101616964 A | 12/2009 |
| CN | 101874211 A | 10/2010 |
| CN | 102686527 A | 9/2012 |
| CN | 103677400 A | 3/2014 |
| CN | 104640911 A | 5/2015 |
| CN | 104765178 A | 7/2015 |
| CN | 104918780 A | 9/2015 |
| CN | 104284776 B | 1/2016 |
| CN | 106023810 A | 10/2016 |
| CN | 106232344 A | 12/2016 |
| CN | 106992221 A | 7/2017 |
| CN | 106992253 A | 7/2017 |
| CN | 106992254 A | 7/2017 |
| CN | 106992255 A | 7/2017 |
| CN | 107073886 A | 8/2017 |
| CN | 107305756 A | 10/2017 |
| CN | 107450784 A | 12/2017 |
| CN | 107452891 A | 12/2017 |
| CN | 107799574 A | 3/2018 |
| CN | 107919436 A | 4/2018 |
| CN | 108292005 A | 7/2018 |
| CN | 207817243 U | 9/2018 |
| CN | 108807463 A | 11/2018 |
| CN | 109326218 A | 2/2019 |
| CN | 109427990 A | 3/2019 |
| CN | 109642964 A | 4/2019 |
| CN | 109659332 A | 4/2019 |
| CN | 109659333 A | 4/2019 |
| CN | 109689827 A | 4/2019 |
| CN | 209102942 U | 7/2019 |
| CN | 110085138 A | 8/2019 |
| CN | 110531897 A | 12/2019 |
| CN | 110669423 A | 1/2020 |
| CN | 209890544 U | 1/2020 |
| CN | 209992964 U | 1/2020 |
| CN | 110782785 A | 2/2020 |
| CN | 110783389 A | 2/2020 |
| CN | 111051052 A | 4/2020 |
| CN | 107615103 B | 12/2020 |
| EP | 1632541 A1 | 3/2006 |
| EP | 2329888 A2 | 6/2011 |
| EP | 2981413 A1 | 2/2016 |
| EP | 2180354 B1 | 8/2017 |
| EP | 3327731 A1 | 5/2018 |
| EP | 3429845 A1 | 1/2019 |
| EP | 3417360 B1 | 9/2019 |
| EP | 3633004 A1 | 4/2020 |
| JP | H06331804 A | 12/1994 |
| JP | 3411009 B2 | 5/2003 |
| JP | 2003266587 A | 9/2003 |
| JP | 3565929 B2 | 9/2004 |
| JP | 3615171 B2 | 1/2005 |
| JP | 2005017544 A | 1/2005 |
| JP | 2005055724 A | 3/2005 |
| JP | 2005144719 A | 6/2005 |
| JP | 2005178176 A | 7/2005 |
| JP | 2005280131 A | 10/2005 |

(56) References Cited

FOREIGN PATENT DOCUMENTS

| | | |
|---|---|---|
| JP | 3751922 B2 | 3/2006 |
| JP | 2006071982 A | 3/2006 |
| JP | 2006155452 A | 6/2006 |
| JP | 3802842 B2 | 7/2006 |
| JP | 3942039 B2 | 7/2007 |
| JP | 2007216435 A | 8/2007 |
| JP | 2008110550 A | 5/2008 |
| JP | 2010515783 A | 5/2010 |
| JP | 4793056 B2 | 10/2011 |
| JP | 5201369 B2 | 6/2013 |
| JP | 2013107382 A | 6/2013 |
| JP | 5296410 B2 | 9/2013 |
| JP | 5518374 B2 | 6/2014 |
| JP | 2015003510 A | 1/2015 |
| JP | 2015083335 A | 4/2015 |
| JP | 201587625 A | 5/2015 |
| JP | 2015174270 A | 10/2015 |
| JP | 2015182272 A | 10/2015 |
| JP | 2015197487 A | 11/2015 |
| JP | 2017013492 A | 1/2017 |
| JP | 2017126620 A | 7/2017 |
| JP | 2017128136 A | 7/2017 |
| JP | 2017132224 A | 8/2017 |
| JP | 6207679 B2 | 10/2017 |
| JP | 2018109773 A | 7/2018 |
| JP | 2018159913 A | 10/2018 |
| JP | 2018180274 A | 11/2018 |
| JP | 6532929 B2 | 6/2019 |
| JP | 6542970 B2 | 7/2019 |
| JP | 6787673 B2 | 11/2020 |
| KR | 100550377 B1 | 2/2006 |
| KR | 20080034534 A | 4/2008 |
| KR | 20140122385 A | 10/2014 |
| KR | 20150110995 A | 10/2015 |
| KR | 20160071174 A | 6/2016 |
| KR | 20160095308 A | 8/2016 |
| KR | 20160103681 A | 9/2016 |
| KR | 20170001102 A | 1/2017 |
| KR | 20170019840 A | 2/2017 |
| KR | 20170019865 A | 2/2017 |
| KR | 20170021033 A | 2/2017 |
| KR | 20170041368 A | 4/2017 |
| KR | 20170041369 A | 4/2017 |
| KR | 20170051909 A | 5/2017 |
| KR | 20170051911 A | 5/2017 |
| KR | 20170059158 A | 5/2017 |
| KR | 20170075663 A | 7/2017 |
| KR | 20170078159 A | 7/2017 |
| KR | 20170097381 A | 8/2017 |
| KR | 20170097401 A | 8/2017 |
| KR | 20170103395 A | 9/2017 |
| KR | 20170103644 A | 9/2017 |
| KR | 101788596 B1 | 10/2017 |
| KR | 20170136033 A | 12/2017 |
| KR | 20180001175 A | 1/2018 |
| KR | 101854524 B1 | 5/2018 |
| KR | 20180067864 A | 6/2018 |
| KR | 20180067865 A | 6/2018 |
| KR | 20180073987 A | 7/2018 |
| KR | 20180074544 A | 7/2018 |
| KR | 20180083171 A | 7/2018 |
| KR | 20180093649 A | 8/2018 |
| KR | 20180096996 A | 8/2018 |
| KR | 101938413 B1 | 1/2019 |
| KR | 101948655 B1 | 2/2019 |
| KR | 20190030912 A | 3/2019 |
| KR | 101971832 B1 | 4/2019 |
| KR | 20190039465 A | 4/2019 |
| KR | 20190039466 A | 4/2019 |
| KR | 20190043427 A | 4/2019 |
| KR | 20190043428 A | 4/2019 |
| KR | 20190044267 A | 4/2019 |
| KR | 20190044360 A | 4/2019 |
| KR | 20190060463 A | 6/2019 |
| KR | 20190081823 A | 7/2019 |
| KR | 102009962 B1 | 8/2019 |
| KR | 102017142 B1 | 9/2019 |
| KR | 20190104565 A | 9/2019 |
| KR | 20190109024 A | 9/2019 |
| KR | 20190109113 A | 9/2019 |
| KR | 102031275 B1 | 10/2019 |
| KR | 102039737 B1 | 11/2019 |
| KR | 102043333 B1 | 11/2019 |
| KR | 102047504 B1 | 11/2019 |
| KR | 102047512 B1 | 11/2019 |
| KR | 20190128557 A | 11/2019 |
| KR | 20190130490 A | 11/2019 |
| KR | 102060541 B1 | 12/2019 |
| KR | 20200003266 A | 1/2020 |
| KR | 102076281 B1 | 2/2020 |
| KR | 20200021406 A | 2/2020 |
| KR | 20200021407 A | 2/2020 |
| KR | 102088674 B1 | 3/2020 |
| KR | 20200022168 A | 3/2020 |
| KR | 20200025036 A | 3/2020 |
| KR | 20200025472 A | 3/2020 |
| KR | 20200030663 A | 3/2020 |
| KR | 20200041042 A | 4/2020 |
| TW | 201441048 A | 11/2014 |
| TW | 201500433 A | 1/2015 |
| TW | 201508827 A | 3/2015 |
| TW | 201525081 A | 7/2015 |
| TW | 201729996 A | 9/2017 |
| TW | 201838815 A | 11/2018 |
| TW | 201922478 A | 6/2019 |
| WO | 2009041533 A1 | 4/2009 |
| WO | 2014011731 A1 | 1/2014 |
| WO | 2014141866 A1 | 9/2014 |
| WO | 2014163352 A1 | 10/2014 |
| WO | 2016208785 A1 | 12/2016 |
| WO | 2017073903 A1 | 5/2017 |
| WO | 2017116103 A1 | 7/2017 |
| WO | 2018070523 A1 | 4/2018 |
| WO | 2018130289 A1 | 7/2018 |
| WO | 2018159918 A1 | 9/2018 |
| WO | 2018186262 A1 | 10/2018 |
| WO | 2018230495 A1 | 12/2018 |
| WO | 2019083606 A1 | 5/2019 |
| WO | 2019085486 A1 | 5/2019 |
| WO | 2019147915 A1 | 8/2019 |
| WO | 2019168005 A1 | 9/2019 |
| WO | 2019217565 A1 | 11/2019 |
| WO | 2019237254 A1 | 12/2019 |
| WO | I760556 B | 4/2022 |

OTHER PUBLICATIONS

Korean Office Action dated Jun. 22, 2022 for Application No. 10-2020-7035352.
Chinese Office Action dated May 31, 2022 for Application No. 201880069545.4.
Taiwan Office Action dated Sep. 3, 2021 for Application No. 107130254.
Taiwan Office Action dated Jul. 20, 2021 for Application No. 109120632.
Chinese Office Action dated Sep. 3, 2021 for Application No. 201980029310.7.
Chinese Office Action dated Oct. 11, 2021 for Application No. 201880069545.4.
Japanese Office Action dated Mar. 30, 2021 for Application No. 2020-522838.
PCT International Search Report/Written Opinion dated Dec. 12, 2018 for Application No. PCT/US2018/048391.
International Search Report and Written Opinion dated Aug. 28, 2019 for Application No. PCT/US2019/031337.
Day-Shan Liu et al: "Adhesion enhancement of hard coatings deposited on flexible plastic substrates using an interfacial buffer layer", Journal of Physics D: Applied Physics, Institute of Physics Publishing LTD, GB, vol. 43, No. 17, May 5, 2010 (May 5, 2019), p. 175301, XP020171087, ISSN: 0022-3727 Experiment; table 1.
Kuhr M et al: "Coatings on plastics with the PICVD technology", Thin Solid F, Elsevier, Amsterdam, NL, vol. 442, No. 1-2, Sep. 17,

(56) References Cited

OTHER PUBLICATIONS 2003 (Sep. 17, 2003), pp. 107-116, XP004458307, ISSN: 0040-6090, DOI: 10.1016/S0040-6090(03)00956-8 Experimental.
International Search Report and the Written Opinion for International Application No. PCT/US2019/040402 dated Oct. 18, 2019.
Taiwanese Office Action and Search Report for TW Application No. 108123820 dated Jul. 30, 2020.
Taiwan Office Action dated Aug. 27, 2020 for Application No. 108116194.
International Search Report and Written Opinion dated Sep. 29, 2020 for Application No. PCT/US2020/037949.
International Search Report and Written Opinion dated Sep. 29, 2020 for Application No. PCT/US2020/037952.
International Search Report and Written Opinion dated Sep. 29, 2020 for Application No. PCT/US2020/037956.
International Search Report and Written Opinion dated Sep. 29, 2020 for Application No. PCT/US2020/037958.
Anonymous: "The Pencil Hardness Test", Dec. 4, 2016, XP055818807, http://web.archive.org/web/20161204152411/http://www.pencilpages.com/articles/simmons.htm, 3 pages.
Extended European Search Report dated Jul. 8, 2021 for Appication No. 18871752.4.
Japanese Office Action dated Jan. 4, 2022 for Application No. 2020-563552.
Chinese Office Action dated Mar. 2, 2022 for Application No. 201880069545.4.
Japanese Office Action dated Mar. 15, 2022 for Application No. 2020-522838.
Japanese Office Action dated Aug. 2, 2022 for Application No. 2020-563552.
Chinese Application No. 201980055267.1, Office Action and Search Report dated Aug. 31, 2022, 14 pages.
Taiwan Office Action dated Sep. 6, 2022 for Application No. 109120632.
Chinese Office Action dated Oct. 18, 2022 for Application No. 201980029310.7.
Taiwan Office Action dated Oct. 5, 2022 for Application No. 111108483.
Japanese Office Action dated Nov. 16, 2021 for Application No. 2020-522838.
Korean Office Action dated Dec. 28, 2022 for Application No. 10-2020-7014780.
Japanese Office Action dated Feb. 28, 2023 for Application No. 2022-103242.
Korean Office Action dated Jul. 14, 2023 for Application No. 10-2020-7014780.

\* cited by examiner

FLEXIBLE COVER LENS FILMS

CROSS-REFERENCE TO RELATED APPLICATIONS

This application is a continuation of U.S. application Ser. No. 16/114,776, filed Aug. 28, 2018, which claims benefit to U.S. Provisional Appl. No. 62/578,175, filed Oct. 27, 2017, which are incorporated herein by reference in their entirety.

BACKGROUND

Field

Implementations described herein generally relate to flexible display devices, and more specifically to flexible cover lens.

Description of the Related Art

Electronic devices often have displays such as liquid crystal displays and organic light-emitting-diode displays. Such displays can be fragile and sensitive to moisture, pressure, or particle contamination. Generally, display devices use several layers of optical devices to colorize, polarize, and shutter light from an illumination source. To prevent damage to the underlying film, a rigid display cover lens layer is mounted over the other layers to prevent damage to the underlying layers. The inclusion of the rigid display cover lens can add undesirable weight to an electronic device. The cover lens can be omitted to reduce the size and weight of a device, but omitting the cover lens can make the display susceptible to damage from scratches.

At the present time, the increasing demands for new functionalities of products and exploiting new and broad applications call for thinner and lighter lens substrates with new properties such as flexibility. Broadly, three main characteristics are desired from a cover lens for these new flexible or foldable displays: 1) optical performance, 2) high hardness, and 3) flexibility. Good optical performance ensures good transmission of light with very little haze. High hardness relates to scratch and abrasion resistance. Flexibility in cover lenses is in terms of have a high enough critical strain that failure due to crack or delamination is avoided when repeatedly bent and folded.

Traditionally while lens has been excellent at addressing the first two characteristics (e.g., optical performance and hardness), it has been poor at the third characteristic, e.g., flexibility, due to its brittle nature. To improve this, significant prior effort has gone into increasing the critical-strain at failure for glass, mainly by reducing the thickness of glass or chemical modification of the materials. Nonetheless, glass as a material for cover lens has been found deficient to address the radius of curvature flexibility sought. Other materials, e.g., various metals, exist with high hardness, very good flexibility but lack the optical performance required in terms of letting light pass through. Alternatively, materials exist with very good optical properties and flexibility but have poor abrasion or scratch resistance, such as polymer-based films.

Therefore, there is a need for a flexible cover lens which has good hardness, impact durability, optical transmission, wear resistance, thermal and chemical stability.

SUMMARY

Implementations described herein generally relate to flexible display devices. In one implementation, a cover lens film with multiple layers of films is disclosed. The cover lens film includes a hard coat layer with a thickness from about 5 µm to about 40 µm, an impact absorption layer with a thickness from about 5 µm to about 150 µm, and a substrate layer between the hard coat layer and the impact absorption layer. The substrate layer has a thickness from about 10 µm to about 175 µm.

In another implementation, a cover lens film is disclosed. The cover lens film includes a first hard coat layer with a thickness from about 5 µm to about 40 µm, a first impact absorption layer with a thickness from about 20 µm to about 110 µm, and a first substrate layer between the first hard coat layer and the first impact absorption layer. The first substrate layer has a thickness from about 10 µm to about 175 µm. The cover lens film also includes a second hard coat layer with a thickness from about 5 µm to about 40 µm, a second impact absorption layer with a thickness from about 20 µm to about 110 µm, and a second substrate layer between the second hard coat layer and the second impact absorption layer. The second substrate layer has a thickness from about 10 µm to about 175 µm.

In another implementation, a display device is disclosed. The display device includes a display structure and a cover lens film. The cover lens film includes a hard coat layer, an impact absorption layer, and a substrate layer between the hard coat layer and the impact absorption layer. The hard coat layer has a thickness from about 5 µm to about 40 µm. The impact absorption layer has a thickness from about 20 µm to about 110 µm. The substrate layer has a thickness from about 10 µm to about 175 µm.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of scope, for the disclosure may admit to other equally effective implementations.

Figure 1:
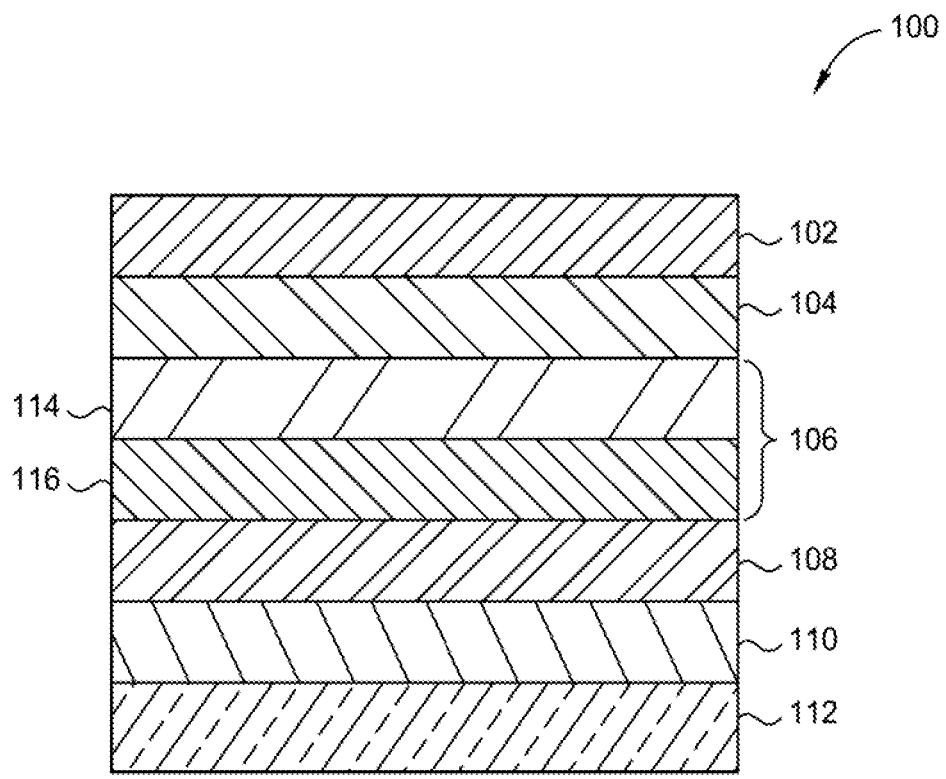
FIG. 1 shows a schematic, cross-sectional view of a display device according to one implementation described herein.

To facilitate understanding, identical reference numerals have been used, where possible, to designate identical elements that are common to the Figures. It is contemplated that elements and features of one implementation may be beneficially incorporated in other implementations without further recitation.

DETAILED DESCRIPTION

Implementations described herein generally relate to flexible display devices, and more specifically to flexible cover lens film replacement with multi-layer film stacks.

FIG. 1 shows a schematic, cross-sectional view of a display device 100 according to one implementation described herein. The display device 100 may be manufactured using plasma enhanced chemical vapor deposition, chemical vapor deposition, physical vapor deposition, atomic layer deposition, physical vapor deposition, photolithography, etching, or other such suitable manufacturing processes. Suitable manufacturing devices may be purchased from Applied Materials, Inc. of Santa Clara, Calif.

The display device 100 includes a cover lens film 102, a film layer 104, a touch panel 106, a display structure 108, a substrate 110, and a shielding layer 112. In the implementation of FIG. 1, the film layer 104 is between the cover lens film 102 and the touch panel 106. In one implementation, the film layer 104 is a multi-function film layer including a polarizer film. The film layer 104, such as polarizer film, is used to reduce unwanted reflections due to the reflective metal that makes up the electrode lines or metallic structures within the display device 100. The film layer may include a quarter-wave retarder or a linear polarizer formed from flexible lens film with a thickness of less than 0.2 mm. The cover lens film 102 may be bonded to the film layer 104 and touch panel 106 with an optically clear adhesive (OCA). In one implementation the OCA is liquid-based adhesive utilized to bond the cover lens film 102 to the touch panel 106. In another implementation, the OCA is an optically clear adhesive tape to bond the cover lens film 102 to the touch panel 106. The touch panel 106 includes a touch sensor IC board 114 and a touch sensor 116. In one implementation, the touch sensor IC board 114 is a flexible and metal base printed circuit board.

In the implementation of FIG. 1, the display structure 108 is between the touch panel 106 and the substrate 110. In one implementation, the display structure 108 is an organic light-emitting diode display. However, other suitable display devices, such as light emitting diode displays or liquid crystal displays, which utilize a cover lens film are contemplated herein. The display structure 108 may include a thin film encapsulation, organic emitting layer, driver IC board, and thin film transistor.

In one implementation, the substrate 110 is made from a polyimide material. However any flexible plastic substrate may be utilized. For instance, the substrate may be or include a polyether ether ketone layer, a transparent conductive polyester layer, polycarbonate, or one or more polymers that is or includes a polyaryletherketone. In the implementation of FIG. 1, the substrate 110 is adjacent the shielding 112. In one implementation, the substrate 110 is polyester terephthalate. In some examples, the shielding 112 is or contains a copper foil. An additional layer, such as an adhesion promoting layer, may be deposited adjacent the substrate 110 prior to any additional layers, such as the shielding 112.

Figure 2:
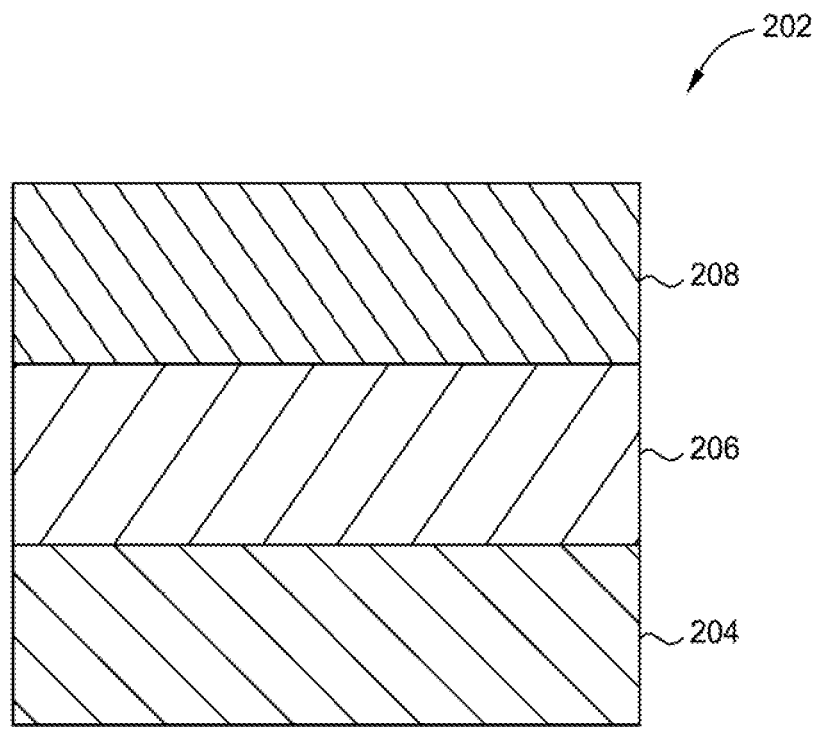
FIG. 2 shows a schematic, cross-sectional view of a cover lens film according to one implementation described herein.

FIG. 2 shows a schematic, cross-sectional view of a cover lens film 202 according to one implementation described herein. The cover lens film 202 may be the cover lens film 102 of FIG. 1. The cover lens film 202 has a pencil hardness from 6H to 9H; flexibility over repeated cycles to bend to up to 1 mm inside-radius of curvature or up to 4 mm out-side radius of curvature; an impact resistance as measure by a standard ball drop test, showing an ability to withhold up to 1 kg steel ball dropped from a >1 m height; a scratch resistance as measured by a standard steel wool test loaded up to 1 kg and able to withstand a large number of cycles, for example, from about 20 cycles to about 3,000 cycles; a total transmission between 85% to 95%; a haze of less than 1%; a yellow index of B*<1; and a high fracture toughness. In the implementation of FIG. 2, the cover lens film 202 includes an impact resistant layer 204, a substrate layer 206, and a hard coat layer 208.

In the implementation of FIG. 2, the substrate 206 is between the impact resistant layer 204 and the hard coat layer 208. In another implementation, the cover lens film 202 includes more than three layers. In some examples, the impact resistant layer 204 has a thickness from about 20 μm to 110 μm. The impact resistant layer 204 includes an elastomer layer with a thickness less than 100 μm. In one implementation, the elastomer layer has a thickness less than 75 μm. In one implementation, the elastomer layer is slot die coated or cast. The impact resistant layer 204 has a transmission of about 90% to about 99.99% ASTM D1003, a haze of less than 1% ASTM D10003, a sandpaper abrasion of less than 0.5% ASTM D1044, and an Erichsen pen scratch of greater than 18N Bosch. The impact resistance layer 204 includes one or more materials selected from ether urethane, ester urethanes, aliphatic urethane, aliphatic polyurethane, aliphatic polyester urethane, or any combination thereof.

In one implementation, the substrate layer 206 has a thickness from about 10 μm to 175 μm. The substrate layer 206 includes one or more materials selected from polyethylene terephthalate (PET), triacetylcellulose, polycarbonate, colorless polyimides, or any combination thereof.

In one implementation, the hard coat layer 208 has a thickness from about 5 μm to 40 μm. The hard coat layer 208 is applied using various Mayer rods, heated in a non-active convection over a temperature from about 75° C. to about 85° C. for a period from about 100 seconds to about 140 seconds, and irradiated with a UV lamp for a period from about 100 seconds to about 140 seconds at a power setting from about 300 mJ/cm$^2$ to about 500 mJ/cm$^2$. The hard coat layer 208 is slot die coated or cast. The hard coat layer 208 has a pencil hardness from 6H to 9H, a bending inside radius from about 2 mm to about 3 mm, a bending outside radius from about 18 mm to about 20 mm, a transmittance from about 90% to about 92%, and a thermal resistance of about −20° C. to about 65° C. The hard coat layer 208 includes one or more materials selected from radiation curable acrylates, aliphatic urethane acrylates, or a combination thereof. In one implementation, the hard coat layer 208 is cured using ultraviolet radiation. In another implementation, the hard coat layer 208 is cured using an electron-beam processing.

It is to be understood that while a three layer structure has been shown for the cover lens film 202, it is contemplated that additional layers may be present. For example, the three layers of the cover lens film 202 may be repeated one or more times to form a layer stack containing a plurality of layers where the total number of layers of the cover lens film 202 is a multiple of 3. In another implementation, the impact resistance layer 204 is between the substrate 206 and the hard coat layer 208. In yet another implementation, the hard coat layer 208 is between the substrate 206 and the impact resistance layer 204. It is contemplated that additional layers may be present. For example, another implementation may include a first hard coat layer, an impact layer, a second hard coat layer, and a substrate. In such an implementation, the impact resistance layer is between the substrate and the first hard coat layer; and the substrate is between the impact resistance layer and the second hard coat layer. Other orientations of the four layers above are also contemplated. For example, in another implementation the first hard impact resistance layer is between the first hard coat layer and the second hard coat layer. The substrate may be adjacent either the first hard coat layer or the second hard coat layer. Another example includes a hard coat layer, a first impact resistance layer, a substrate, and a second impact resistance layer. In such an implementation, the substrate is between the first impact resistance layer and the second impact resistance layer and the hard coat layer is adjacent the first impact resistance layer.

Figure 3:
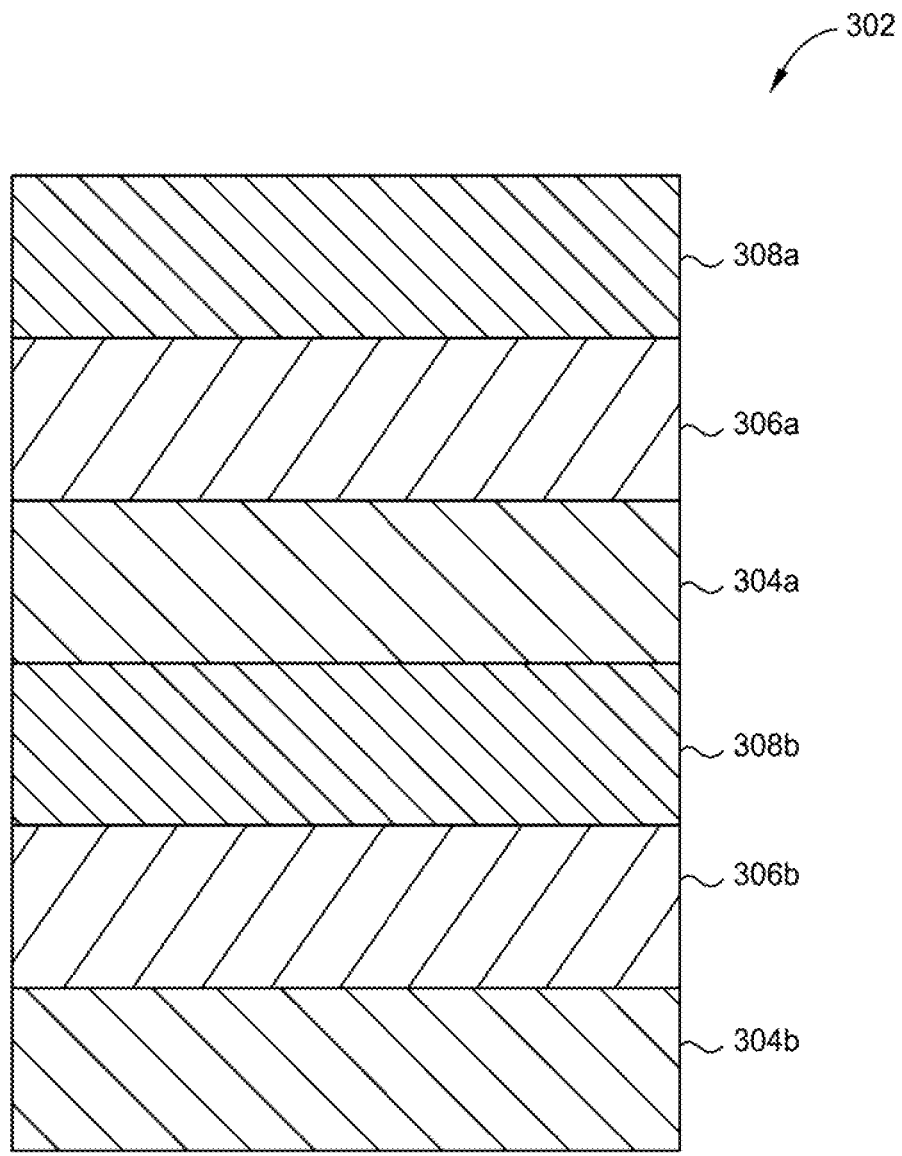
FIG. 3 shows a schematic, cross-sectional view of a cover lens film according to another implementation described herein.

FIG. 3 shows a schematic, cross-sectional view of a cover lens film 302 according to another implementation described herein. The cover lens film 302 may be the cover lens film 102 of FIG. 1. The cover lens film 302 includes repeating stacks of a hard coat layer 308, a substrate 306, and an impact resistant layer 304. In the implementation of FIG. 3, there are two stacks of the repeating layers: a first hard coat layer 308a, a first substrate layer 306a, a first impact resistant layer 304a, a second hard coat layer 308b, a second substrate layer 306b, and a second impact resistant layer 304b. The hard coat layers 308a, 308b, the substrate layers 306a, 306b, and the impact resistant layers 304a, 304b are substantially similar to the hard coat layer 208, the substrate 208, and the impact resistant layer 204 of FIG. 2. In the implementation of FIG. 3, the substrate layer 306a is between the hard coat layer 308a and the impact resistant layer 304a. In the implementation of FIG. 3, the substrate layer 306b is between the hard coat layer 308b and the impact resistant layer 304b. In one implementation, the impact resistant layer 304a is adjacent the hard coat layer 308a. In another implementation, the impact resistant layer 304a is adjacent the impact resistant layer 304b. In another implementation, the cover lens film includes additional layers such as an adhesion layer.

The cover lens film described herein may be used in any display device. The flexible cover lens film has good strength, elasticity, optical transmission, wear resistance, and thermostability. By combining the hard coat layer and the impact resistant layer, the cover lens film is both flexible and strong with hardness from 6H to 9H.

While the foregoing is directed to implementations of the disclosure, other and further implementations may be devised without departing from the basic scope thereof, and the scope thereof is determined by the claims that follow.

What is claimed is:

1. A cover lens film comprising:
a hard coat layer, wherein the hard coat layer has a thickness from about 5 μm to about 40 μm, a hardness from 6H to 9H, and a bending inside radius from about 2 mm to about 3 mm;
an impact absorption layer, wherein the impact absorption layer has a thickness from about 20 μm to about 110 μm, a transmission of about 90% to about 99.99% per ASTM D1003, and a haze of less than 1% per ASTM D1003; and
a substrate layer between the hard coat layer and the impact absorption layer, wherein the substrate layer has a thickness from about 10 μm to about 175 μm.

2. The cover lens film of claim 1, wherein the substrate layer is a material selected from the group consisting of polyethylene terephthalate, triacetylcellulose, polycarbonate, colorless polyimide, and any combination thereof.

3. The cover lens film of claim 1, wherein the hard coat layer is a material selected from the group consisting of radiation curable acrylate and aliphatic urethane acrylate.

4. The cover lens film of claim 1, wherein the impact absorption layer is a material selected from the group consisting of ether urethane, ester urethane, aliphatic urethane, aliphatic polyurethane, aliphatic polyester urethane, and any combination thereof.

5. The cover lens film of claim 1, wherein the hard coat layer has a thermal resistance of about −20° C. to about 65° C.

6. A cover lens film comprising:
a first hard coat layer, wherein the first hard coat layer has a thickness from about 5 μm to about 40 μm, a hardness from 6H to 9H, and a bending inside radius from about 2 mm to about 3 mm;
a first impact absorption layer, wherein the first impact absorption layer has a thickness from about 20 μm to about 110 μm, a transmission of about 90% to about 99.99% per ASTM D1003, and a haze of less than 1% per ASTM D1003;
a first substrate layer between the first hard coat layer and the first impact absorption layer, wherein the first substrate layer has a thickness from about 10 μm to about 175 μm;
a second hard coat layer, wherein the second hard coat layer has a thickness from about 5 μm to about 40 μm, a hardness from 6H to 9H, and a bending inside radius from about 2 mm to about 3 mm;
a second impact absorption layer, wherein the second impact absorption layer has a thickness from about 20 μm to about 110 μm; and
a second substrate layer between the second hard coat layer and the second impact absorption layer, wherein the second substrate layer has a thickness from about 10 μm to 175 μm.

7. The cover lens film of claim 6, wherein the first substrate layer is a material selected from the group consisting of polyethylene terephthalate, triacetylcellulose, polycarbonate, colorless polyimide, and any combination thereof.

8. The cover lens film of claim 6, wherein the first hard coat layer is a material selected from the group consisting of radiation curable acrylate and aliphatic urethane acrylate.

9. The cover lens film of claim 6, wherein the first impact absorption layer is a material selected from the group consisting of ether urethane, ester urethane, aliphatic urethane, aliphatic polyurethane, aliphatic polyester urethane, and any combination thereof.

10. The cover lens film of claim 6, wherein the second hard coat layer is a material selected from the group consisting of radiation curable acrylate and aliphatic urethane acrylate.

11. The cover lens film of claim 6, wherein the second impact absorption layer is a material selected from the group consisting of ether urethane, ester urethane, aliphatic urethane, aliphatic polyurethane, aliphatic polyester urethane, and any combination thereof.

12. The cover lens film of claim 6, wherein the first hard coat layer has a thermal resistance of about −20° C. to about 65° C.

13. The cover lens film of claim 6, wherein the first impact absorption layer or the second impact absorption layer has an abrasion resistance of less than 0.5% per ASTM D1044.

14. A display device comprising:
a display structure; and
a cover lens film comprising:
a hard coat layer, wherein the hard coat layer has a thickness from about 5 μm to about 40 μm, a hardness from 6H to 9H, and a bending inside radius from about 2 mm to about 3 mm;
an impact absorption layer, wherein the impact absorption layer has a thickness from about 20 μm to about 110 μm, a transmission of about 90% to about 99.99% per ASTM D1003, and a haze of less than 1% per ASTM D1003; and
a substrate layer between the hard coat layer and the impact absorption layer, wherein the substrate layer has a thickness from about 10 μm to about 175 μm.

15. The display device of claim 14, wherein the display structure comprises an OLED display.

16. The display device of claim 14, wherein the display structure comprises an LCD display.

17. The display device of claim 14, wherein the hard coat layer is a material selected from the group consisting of radiation curable acrylate and aliphatic urethane acrylate.

18. The display device of claim 14, wherein the impact absorption layer is a material selected from the group consisting of ether urethane, ester urethane, aliphatic urethane, aliphatic polyurethane, aliphatic polyester urethane, and any combination thereof.

19. The display device of claim 14, wherein the substrate layer is a material selected from the group consisting of polyethylene terephthalate, triacetylcellulose, polycarbonate, colorless polyimide, and any combination thereof.

20. The display device of claim 14, wherein the hard coat layer has a thermal resistance of about −20° C. to about 65° C.

\* \* \* \* \*